US010692880B2

(12) United States Patent
Cui et al.

(10) Patent No.: US 10,692,880 B2
(45) Date of Patent: Jun. 23, 2020

(54) 3D NAND HIGH ASPECT RATIO STRUCTURE ETCH

(71) Applicant: Applied Materials, Inc., Santa Clara, CA (US)

(72) Inventors: Zhenjiang Cui, San Jose, CA (US); Hanshen Zhang, Cupertino, CA (US); Anchuan Wang, San Jose, CA (US); Zhijun Chen, San Jose, CA (US); Nitin K. Ingle, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/855,465

(22) Filed: Dec. 27, 2017

(65) Prior Publication Data

US 2018/0182777 A1    Jun. 28, 2018

Related U.S. Application Data

(60) Provisional application No. 62/439,785, filed on Dec. 28, 2016, provisional application No. 62/439,416, filed on Dec. 27, 2016.

(51) Int. Cl.
*H01L 27/11582*    (2017.01)
*H01L 21/311*    (2006.01)
(Continued)

(52) U.S. Cl.
CPC .. *H01L 27/11582* (2013.01); *H01L 21/31116* (2013.01); *H01L 21/31122* (2013.01); *H01L 21/32136* (2013.01); *H01L 21/32137* (2013.01); *H01L 21/67069* (2013.01); *H01L 23/291* (2013.01); *H01L 23/3171* (2013.01); *H01L 27/11556* (2013.01)

(58) Field of Classification Search
CPC ......... H01L 21/31116; H01L 21/32136; H01L 21/32137; H01L 21/67069; H01L 21/30655; H01L 27/11582; H01L 27/11556
See application file for complete search history.

(56) References Cited

U.S. PATENT DOCUMENTS

6,284,666 B1 * 9/2001 Naeem ................ H01L 21/3065
257/E21.218
9,299,580 B2    3/2016 Kong et al.
(Continued)

*Primary Examiner* — Ermias T Woldegeorgis
(74) *Attorney, Agent, or Firm* — Patterson + Sheridan LLP (57) ABSTRACT

Embodiments of the present disclosure provide methods for forming features in a film stack. The film stack may be utilized to form stair-like structures with accurate profiles control in manufacturing three dimensional (3D) stacking of semiconductor chips. In one example, a method includes exposing a substrate having a multi-material layer formed thereon to radicals of a remote plasma to form one or more features through the multi-material layer, the one or more features exposing a portion of a top surface of the substrate, and the multi-material layer comprising alternating layers of a first layer and a second layer, wherein the remote plasma is formed from an etching gas mixture comprising a fluorine-containing chemistry, and wherein the process chamber is maintained at a pressure of about 2 Torr to about 20 Torr and a temperature of about −100° C. to about 100° C.

13 Claims, 4 Drawing Sheets

(51) Int. Cl.
*H01L 21/3213* (2006.01)
*H01L 23/31* (2006.01)
*H01L 21/67* (2006.01)
*H01L 27/11556* (2017.01)
*H01L 23/29* (2006.01)

(56) References Cited

U.S. PATENT DOCUMENTS

2008/0286978 A1* 11/2008 Chen ................ H01L 21/30655
　　　　　　　　　　　　　　　　　　438/713
2015/0371869 A1* 12/2015 Surla ................ H01L 21/31127
　　　　　　　　　　　　　　　　　　438/723
2016/0056050 A1*  2/2016 Kong ................ H01L 21/31116
　　　　　　　　　　　　　　　　　　438/723

* cited by examiner

3D NAND HIGH ASPECT RATIO STRUCTURE ETCH

CROSS-REFERENCE TO RELATED APPLICATIONS

This application claims priority to U.S. provisional patent application Ser. No. 62/439,785, filed Dec. 28, 2016, and U.S. provisional patent application Ser. No. 62/439,416, filed Dec. 27, 2016, which are herein incorporated by reference.

FIELD

Embodiments of the present disclosure generally relate to methods of forming high aspect ratio features in a vertical type semiconductor device.

BACKGROUND

The growing demands of mobile computing and data centers continue to drive the need for high-capacity, high-performance NAND flash technology. With planar NAND nearing its practical scaling limits, NAND flash memory has moved from a planar configuration to a vertical configuration (VNAND). This vertical configuration permits the memory devices to be formed at significantly greater bit density. In manufacturing stacking of 3D semiconductor chips, stair-like structures are often utilized to allow multiple interconnection structures to be disposed thereon, forming high-density of vertical transistor devices.

When forming features, such as trenches or vias, in stair-like structures in a film stack disposed on a substrate, an etch process using a photoresist layer as an etching mask is often utilized. The film stack typically includes multiple material layers in which the features, such as trenches or contact holes, are formed with high aspect ratios. High aspect ratio is generally defined as the ratio between the depth of the feature and the width of the feature, for at least about 20:1 and greater. In an exemplary embodiment depicted in FIG. 4 (Prior Art), a photoresist layer (not shown) may serve as an etching mask layer to transfer structures onto a film stack 400 disposed on a substrate 404 to form stair-like structures 410 on the substrate 404. The film stack 300 typically includes alternating layers of layers 402a, 402b (shown as $402a_1$, $402b_1$, $402a_2$, $402b_2$, ..., $402n_1$, $402n_2$), either conductive layers or insulating layers. For example, the film stack may include alternating layers of $SiO_2$/Si, SiO/SiN, $SiO_2$/W, or W/TiN with thickness up to several microns. One of these two materials needs to be etched or recessed selectively within the contact holes to form memory cells.

Figure 4:
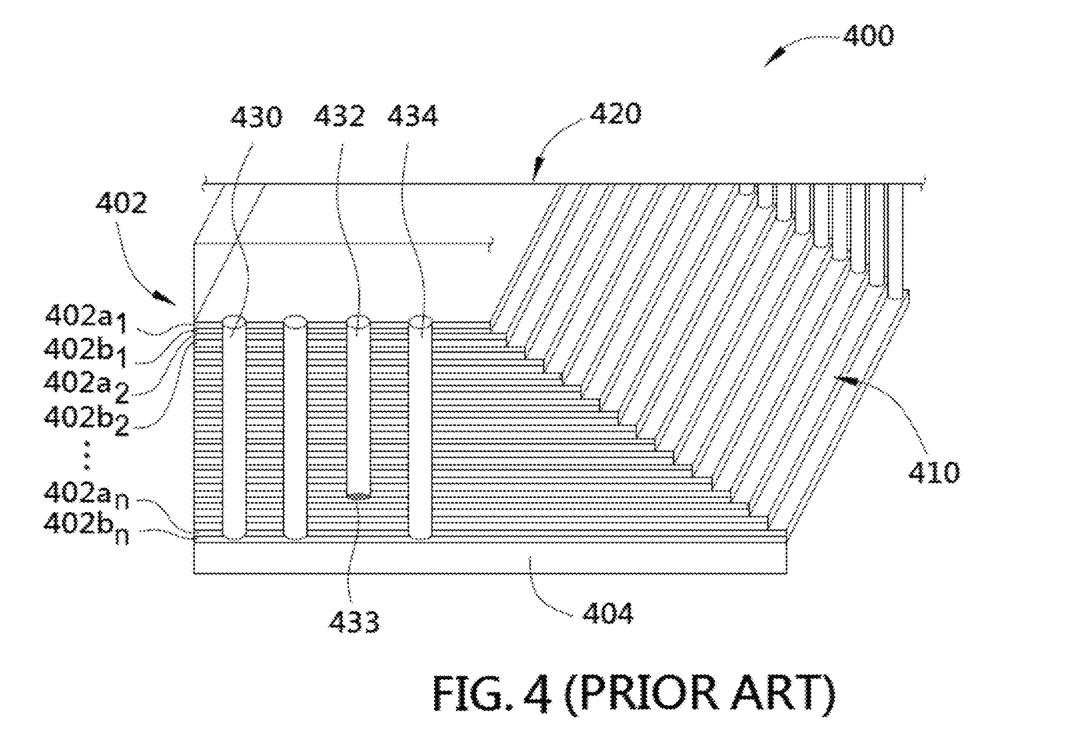
FIG. 4 (Prior Art) illustrates a schematic cross-sectional view of conventional features formed in a film stack disposed on a substrate.

During etching, features 430 with high aspect ratio, such as greater than about 5:1 or above, for example about 10:1 or above, may be formed into the film stack 400. Due to the high aspect ratio, however, it has been challenging for traditional plasma dry etch or wet etch to etch the sidewall W/TiN Si, or SiN uniformly from the top portion of the contact holes to the bottom portion of the contact holes, causing greater recessing of the material, for example tungsten, near the top portion of the contact holes than at the bottom portion (i.e., irregular dimensional profiles of the etched structures). In addition, redeposition or build-up of by-products or other materials generated during the etch process may accumulate and/or attach on the top and/or sidewalls of the features 430, 432, 434 being etched, thereby blocking the opening the feature 430, 432, 434 being formed in the film stack 400 and thus preventing etching through the entire film stack 400. Moreover, as the opening of the etched features 432 are narrowed and/or sealed by the accumulated redeposition material, the reactive etchants are prevented from reaching the lower surface 433 of the features 432, thereby limiting the aspect ratio that may be obtained.

Thus, there is a need for improved methods for forming high aspect ratio features, such as forming features in stair-like structures, with accurate profiles and dimension control for three dimensional (3D) stacking of semiconductor chips.

SUMMARY

Embodiments of the present disclosure provide methods for forming features in a film stack that may be utilized to form stair-like structures with accurate profiles control in manufacturing three dimensional (3D) stacking of semiconductor chips. In one embodiment, a method includes exposing a substrate having a multi-material layer formed thereon to radicals of a remote plasma to form one or more features through the multi-material layer, the one or more features exposing a portion of a top surface of the substrate, and the multi-material layer comprising alternating layers of a first layer and a second layer, wherein the remote plasma is formed from an etching gas mixture comprising a fluorine-containing chemistry, and wherein the process chamber is maintained at a pressure of about 2 Torr to about 20 Torr and a temperature of about −100° C. to about 100° C.

In another embodiment, a structure is provided. The structure includes a substrate having a multi-material layer formed thereon, the multi-material layer comprising alternating layers of a first layer and a second layer, one or more features formed through the multi-material layer to expose a portion of a top surface of the substrate, and a passivation layer formed on exposed surfaces of a top portion of the one or more features, wherein a ratio of the coverage of the passivation layer to a depth of the features is 1:2 to about 1:8.

In yet another embodiment, a method includes exposing a substrate having a multi-material layer formed thereon to radicals of a remote plasma to form one or more features through the multi-material layer, the one or more features exposing a portion of a top surface of the substrate, and the multi-material layer comprising alternating layers of a first layer and a second layer, and exposing exposed surfaces of a top portion of the one or more features to an oxygen-containing gas to oxidize the exposed surfaces of the top portion, wherein a ratio of the coverage of the oxidized surfaces to a depth of the features is 1:2 to about 1:8, and purging the process chamber.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Figure 1:
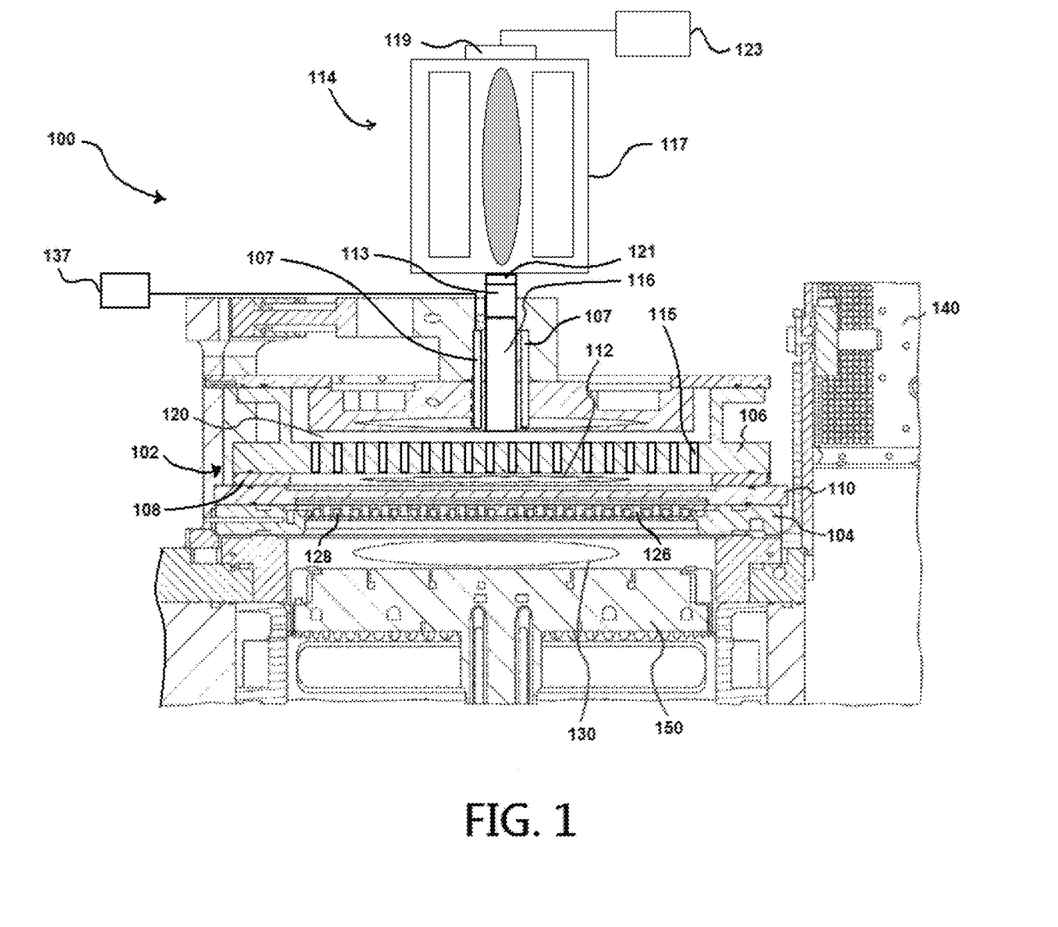
FIG. 1 shows a cross-sectional view of a plasma processing system 100 that may be used to perform implementations of the present disclosure.

FIG. 1 shows a cross-sectional view of a plasma processing system 100 that may be used to perform implementations of the present disclosure. Suitable processing systems that may be adapted for use with the implementations disclosed herein include, for example, Producer® Selectra™ Etch system available from Applied Materials, Inc. of Santa Clara, Calif. The plasma processing system 100 generally includes a capacitively coupled plasma (CCP) unit 102 and a remote plasma source (RPS) unit 114 coupled to the CCP unit 102. The plasma processing system 100 may hold an internal pressure different than the outside world. For example, the pressure inside the plasma processing system 100 may be about 10 mTorr to about 20 Torr.

The CCP unit 102 functions to generate a first plasma source inside the hybrid plasma processing system 100. The CCP unit 102 may include a lid 106 and an ion suppression element 110 disposed relatively below the lid 106. In some implementations, the lid 106 and the ion suppression element 110 are electrically conductive electrodes that can be electrically biased with respect to each other to generate an electric field strong enough to ionize gases between the lid 106 and the ion suppression element 110 into a plasma. A plasma generating gas mixture may be supplied to the CCP unit 102 from a gas source 137 through a gas inlet 107. An electrical insulator 108 may be disposed between the lid 106 and the ion suppression element 110 to prevent them from short circuiting when a plasma is generated. The exposed surfaces of the lid 106, insulator 108, and the ion suppression element 110 generally define a plasma excitation region 112 in the CCP unit 102.

A power supply 140 is electrically coupled to the CCP unit 102 to provide electric power to the lid 106 and/or ion suppression element 110 to generate a plasma in the plasma excitation region 112. The power supply 140 is operable to create an adjustable bias voltage in the ion suppression element 110 to adjust an ion concentration in the activated gas passing from the plasma excitation region 112 to the gas reaction region 130. In one implementation, plasma generating gases may travel from a RPS unit 114 through a gas inlet 116 into the plasma excitation region 112. The RPS unit 114 functions to generate a second plasma source inside the hybrid plasma processing system 100. The RPS unit 114 may include a tube 117 where a plasma of ions, radicals, and electrons is generated. The tube 117 may have a gas inlet 119 disposed at one end of the tube 117 and a gas outlet 121 disposed at the other end of the tube 117 opposing the gas inlet 119. The gas inlet 119 is coupled to a gas source 123 while the gas outlet 121 is in fluid communication with the plasma excitation region 112. The RPS unit 114 may be coupled to an energy source (not shown) to provide an excitation energy, such as an energy having a microwave frequency, to the RPS unit 114 to excite the process gas traveling from the gas source 123 into a plasma. The plasma generating gases from the RPS unit 114 may be used to strike a plasma in the plasma excitation region 112, or may maintain a plasma that has already been formed in the plasma excitation region 112. The RPS plasma excited species may include ionically-charged plasma species as well as neutral and radical species.

The plasma may be formed in the RPS unit 114 using a microwave, RF, or thermal approach. When the plasma excited species reach the plasma excitation region 112, they may be further excited in the CCP unit 102, or pass through the plasma excitation region 112 without further excitation.

In general, plasma sources generated by, for example, an energetic excitation of gaseous molecules consisting of a plasma of charged ions, radicals, and electrons. In some processes where radicals of a plasma are desirable (as they react in a much more desirable manner with silicon or polysilicon material on a substrate than ions or a mixture of radicals and ions), an appropriate ion filter 113, such as electrostatic filters, wire or mesh filters, or magnetic filters, may be used between the RPS unit 114 and the CCP unit 102 to eliminate the majority or substantially all of the ions of the plasma such that only radicals of the plasma flow through the CCP unit 102 and react with silicon or polysilicon material on the substrate, thereby obtaining a greater selectivity of processing of silicon or polysilicon material than other material (e.g., silicon oxide) on the substrate. The electrodes of the CCP unit 102 may or may not be powered so that the radicals of the plasma from the RPS unit 114 bypass the CCP unit 102 to avoid or minimize undesired reaction occurred in the plasma excitation region 112.

The plasma generating gases and/or plasma excited species may pass through a plurality of through holes 115 in the lid 106 for a more uniform delivery into the plasma excitation region 112. The gas inlet 116 is in fluid communication manner to a gas supply region 120 partitioned from the plasma excitation region 112 by the lid 106 so that the gases/species flow through the holes 115 in the lid 106 into the plasma excitation region 112.

As noted above, the lid 106 and the ion suppression element 110 may function as a first electrode and a second electrode, respectively, so that the lid 106 and/or ion suppression element 110 may receive an electric charge. In these configurations, electrical power (e.g., RF power) may be applied to the lid 106, ion suppression element 110, or both. For example, electrical power may be applied to the lid 106 while the ion suppressor 110 is grounded. The hybrid plasma processing system 100 may include a RF generator 140 that provides electrical power to the lid 106 and/or ion suppression element 110. The electrically charged lid 106 may facilitate a uniform distribution of plasma (i.e., reduce localized plasma) within the plasma excitation region 112. To enable formation of a plasma in the plasma excitation region 112, insulator 108 may electrically insulate the lid 106 and the ion suppression element 110.

The ion suppression element 110 may include a plurality of through holes (not shown) that further suppress the migration of ionically-charged species out of the plasma excitation region 112 while allowing uncharged neutral or radical species to pass through the ion suppression element 110 into an activated gas delivery region 124. Controlling the amount of ionic species passing through the ion suppression element 110 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., SiOx:SiNx etch ratios, Poly-Si:SiOx etch ratios, etc.).

The showerhead 104 is positioned between the ion suppression element 110 of the CCP unit 102 and a gas reaction region 130 (i.e., gas activation region) that makes contact with a substrate that may be placed on a pedestal 150. The gases and plasma excited species may pass through the ion suppression element 110 into an activated gas delivery region 124 that is defined between the ion suppression element 110 and the showerhead 104. A portion of these gases and species may further pass through the showerhead 104 into a gas reaction region 130 in which the substrate is disposed.

In one implementation, the showerhead 104 is a dual-zone showerhead that has a first set of channels 126 to permit the passage of plasma excited species coming from the plasma excitation region 112, and a second set of channels 128 that deliver a second gas/precursor mixture into the gas reaction/activation region 130. The first set of channels 126 may traverse the thickness of the showerhead 104. Each channel of the first set of channels 126 may have an opening facing the gas reaction/activation region 130, and the opening may have a smaller diameter than the diameter of the channel 126. The second set of channels 128 in the showerhead 104 may not traverse the thickness of the showerhead 104. Therefore, the second set of channels 128 are not in fluid communication with the plasma excitation region 112. Instead, the second set of channels 128 are fluidly coupled to a source gas/precursor mixture (not shown) that is selected for the process to be performed. When the plasma processing system 100 is configured to perform an etch on the substrate surface, the source gas/precursor mixture may include etchants such as fluorine based gases, oxidants, halogens, water vapor and/or carrier gases that mix in the gas reaction region 130 with plasma excited species distributed from the first set of channels 126 in the showerhead 104. The two sets of channels 126, 128 prevent the plasma excited species and second gas/precursor mixture from combining until they reach the gas reaction region 130.

The plasma processing system 100 also includes a pedestal 150 that is operable to support and move the substrate (e.g., a wafer substrate). The pedestal may be vertically or axially adjustable within the processing chamber 100 to increase or decrease distance between the pedestal 150 and the showerhead 104, which defines the gas reaction region 130. The pedestal 150 may have a heat exchange channel through which a heat exchange fluid (e.g., water) flows to control the temperature of the wafer substrate. Circulation of the heat exchange fluid allows the substrate temperature to be maintained at relatively low temperatures (e.g., about −20° C. to about 90° C.). The pedestal 150 may also be configured with a heating element (such as a resistive heating element) embedded therein to maintain the substrate at desired heating temperatures (e.g., about 90° C. to about 1100° C.).

By combining a RPS unit 114 with a CCP unit 102, the plasma excited species may be generated by the CCP unit 102 alone, the RPS unit 114 alone, or both. The CCP unit 102 may serve as a primary plasma source while the RPS unit 114 may serve as a secondary plasma source, or vice versa, depending upon the process scheme. In cases where the process requires higher power input (550 W or above), both CCP unit 102 and RPS unit 114 may be used to generate plasma excited species so that some power burden is shifted from the CCP unit 102 to the RPS unit 114, which allows the CCP unit 102 to operate at lower power, thereby reducing ion bombardment of the powered electrode in the CCP to a lesser extent.

Figure 2:
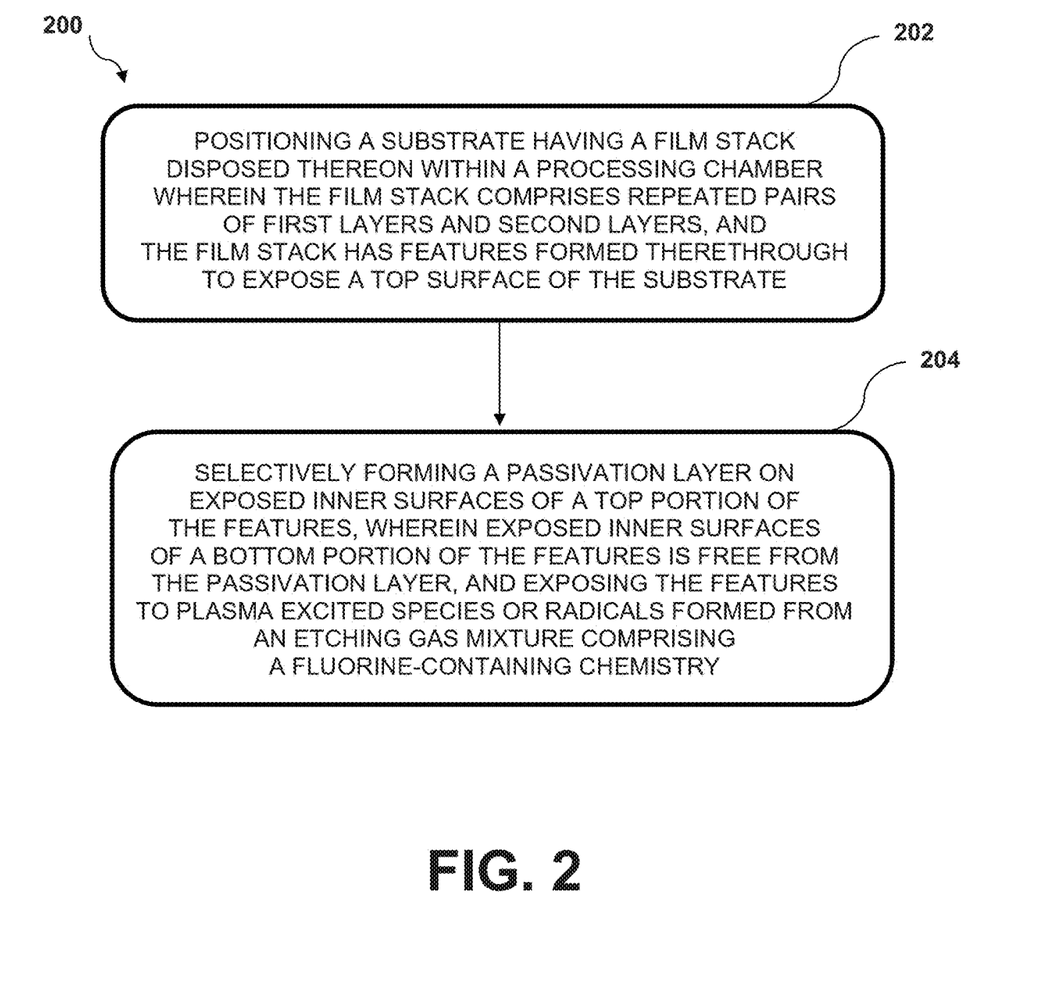
FIG. 2 is a flow diagram of a method for etching features in a film stack that may be utilized to form features on a substrate.
Figure 3A:
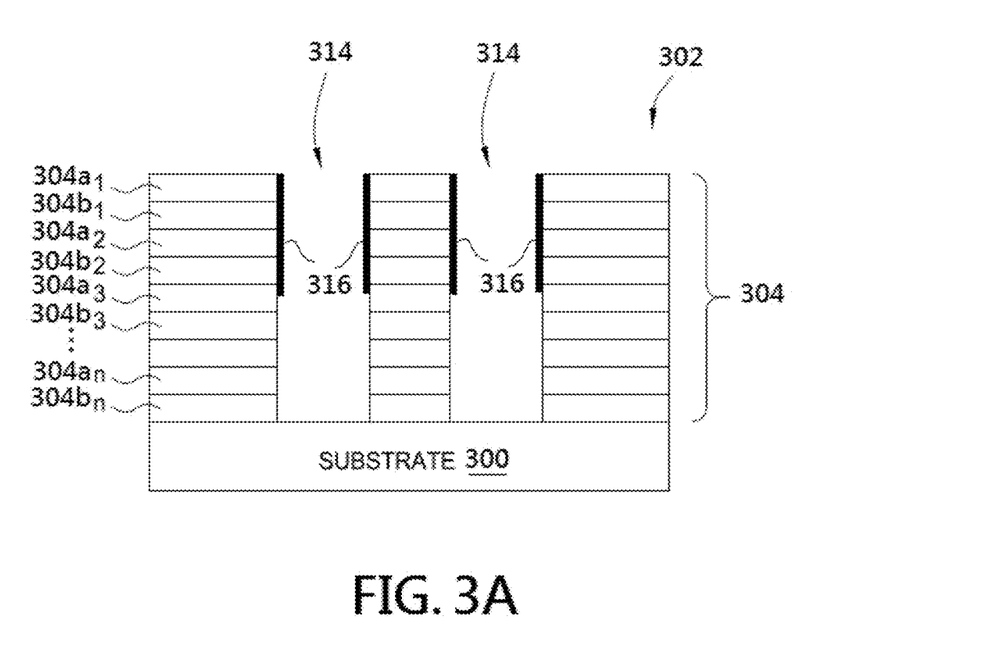
FIGS. 3A and 3B are schematic cross-sectional views of features in a film stack disposed on a substrate according to the method of FIG. 2.
Figure 3B:
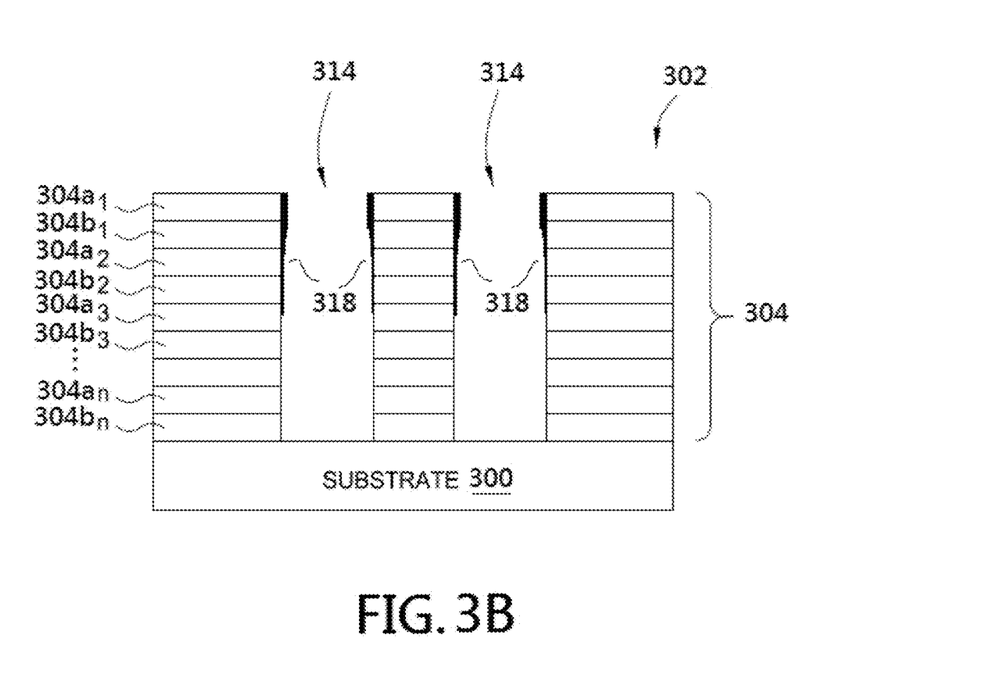

FIG. 2 is a flow diagram of a method 200 for etching features in a film stack that may be utilized to form features on a substrate. The method 200 may be performed in a processing system, such as the plasma processing system 100 depicted in FIG. 1 or other suitable processing chambers. FIGS. 3A and 3B are schematic cross-sectional views of features in a film stack disposed on a substrate according to some implementations of the method 200. The method 200 may be utilized to etch high aspect ratio features, e.g., greater than 10:1, for semiconductor devices, particularly for three dimensional (3D) stacking of semiconductor memory. Although the method 200 is described below with reference to a substrate utilized to manufacture features in a film stack that may be utilized to form stair-like structures for three dimensional semiconductor chips, the method 200 may also be used to advantage in other applications for manufacturing other types of devices.

The method 200 begins at block 202 by transferring a substrate, such as a substrate 400 depicted in FIG. 3A, onto a substrate support pedestal assembly disposed in a processing chamber, such as the pedestal 150 of the processing chamber 200 depicted in FIG. 1. The substrate 300 has a film stack 302 formed thereon. The substrate 300 may be a silicon based material or any suitable insulating materials or conductive materials as needed. The film stack 302 may be utilized to form a gate structure, a contact structure or an interconnection structure in the front end or back end processes. The substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 300 may have various dimensions, such as 200 mm, 300 mm, 450 mm or other diameter wafers, as well as, rectangular or square panels. Unless otherwise noted, implementations and examples described herein are conducted on substrates with a 200 mm diameter, a 300 mm diameter, a 450 mm diameter substrate. In the implementation wherein a SOI structure is utilized for the substrate 300, the substrate 300 may include a buried dielectric layer disposed on a silicon crystalline substrate. In the example depicted herein, the substrate 300 is a crystalline silicon substrate.

In one implementation, the film stack 302 disposed on the substrate 300 has a multi-material layer 304 that has a number of vertically stacked layers. The multi-material layer 304 may include pairs of layers, for example a stack of first layers (shown as $304a_1, 304a_2, \ldots, 304a_n$) and a stack of second layers (shown as $304b_1, 304b_2, \ldots, 304b_n$) repeatedly formed over the substrate 300. In one embodiment, the multi-material layer 304 includes alternating layers of the first layer (shown as $304a_1, 304a_2, \ldots, 304a_n$) and the second layer (shown as $304b_1, 304b_2, \ldots, 304b_n$) repeatedly formed over the substrate 300.

The multi-material layer 304 formed in the film stack 302 may be a part of a semiconductor chip, such as a three-dimensional (3D) memory chip. Although FIG. 3A shows three repeating layers of first layers (shown as $304a_1, 304a_2, \ldots, 304a_n$) and second layers (shown as $304b_1, 304b_2, \ldots, 304b_n$) alternately laminated on the substrate 300, any desired number of repeating pairs comprised of first and the second layers may be utilized as needed.

In one implementation, the multi-material layer 304 may be utilized to form multiple gate structures for a three-dimensional (3D) memory chip. The first layers $304a_1$, $304a_2$, ..., $304a_n$, formed in the multi-material layer 304 may be a first dielectric layer and the second layers $304b_1$, $304b_2$, ..., $304b_n$ may be a second dielectric layer. Suitable dielectric layers may be utilized to form the first layers $304a_1$, $304a_2$, ..., $304a_n$ and the second layers $304b_1$, $304b_2$, ..., $304b_n$ include silicon oxide, silicon nitride, silicon oxynitride, silicon carbide, silicon oxycarbide, composite of oxide and nitride, at least one or more oxide layers sandwiching a nitride layer, and combinations thereof, among others. In one embodiment, the first layers $304a_1$, $304a_2$, ..., $304a_n$ is silicon oxide and the second layers $304b_1$, $304b_2$, ..., $304b_n$ is silicon nitride. In another embodiment, the first layers $304a_1$, $304a_2$, ..., $304a_n$ is silicon oxynitride and the second layers $304b_1$, $304b_2$, ..., $304b_n$ is silicon oxycarbide.

In some embodiments, the first layers $304a_1$, $304a_2$, ..., $304a_n$ and/or second layers $304b_1$, $304b_2$, ..., $304b_n$ may be formed from a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide (ZrSiO2), tantalum dioxide ($TaO_2$), aluminum oxide, aluminum doped hafnium dioxide, bismuth strontium titanium (BST), and platinum zirconium titanium (PZT), among others. In some embodiments, the first layers $304a_1$, $304a_2$, ..., $304a_n$ may be a dielectric layer such as silicon oxide, silicon nitride, silicon oxynitride, silicon carbide, silicon oxycarbide, composite of oxide and nitride mentioned above, and the second layers $304b_1$, $304b_2$, ..., $304b_n$ may be a high-k material discussed above, or vice versa.

In some examples, the first layers $304a_1$, $304a_2$, ..., $304a_n$ and the second layers $304b_1$, $304b_2$, ..., $304b_n$ may be a conductive layer selected from a group consisting of doped silicon, such as n-type or p-type doped silicon, other suitable silicon containing material, tungsten (W), tungsten silicide (WSi), tungsten polysilicon (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, nitride compound thereof, such as titanium nitride (TiN) and tantalum nitride (TaN), and combinations thereof, among others. In one embodiment, the first layers $304a_1$, $304a_2$, ..., $304a_n$ is W and the second layers $304b_1$, $304b_2$, ..., $304b_n$ is TiN. In another embodiment, the first layers $304a_1$, $304a_2$, ..., $304a_n$ is W and the second layers $304b_1$, $304b_2$, ..., $304b_n$ is TaN.

In one exemplary example, the first layers $304a_1$, $304a_2$, ..., $304a_n$, are silicon oxide layers and the second layers $304b_1$, $304b_2$, ..., $304b_n$ are silicon nitride layers or polysilicon layers disposed on the first layers $304a_1$, $304a_2$, ..., $304a_n$. In one embodiment, the thickness of first layers $304a_1$, $304a_2$, ..., $304a_n$ may be controlled at between about 50 Å and about 1000 Å, such as about 500 Å, and the thickness of the each second layers $304b_1$, $304b_2$, ..., $304b_n$ may be controlled at between about 50 Å and about 1000 Å, such as about 500 Å. The multi-material layers 304 may have a total thickness between about 100 Å and about 2000 Å.

At block 204, an etching gas mixture is supplied into a remote plasma source (RPS) unit of the processing system, such as the RPS unit 114 of FIG. 1. The etching gas mixture can be excited in the RPS unit 114 using a microwave, RF, or thermal approach. In one implementation, the etching gas mixture is excited using a RF power applied at a high frequency, such as greater than 2.5 MHz. The plasma excited species are then flowed to the plasma excitation region 112, where they may be further excited in the CCP unit 102, or pass through the plasma excitation region 112 without further excitation. In some cases where radicals of a plasma are desired (as they react in a much more desirable manner with silicon or polysilicon material on a substrate than ions or a mixture of radicals and ions), the majority or substantially all of the ions of the plasma may be eliminated using an ion filter, such as the ion filter 113 shown in FIG. 1. As a result, only radicals of the plasma flow through the CCP unit 102 and react with target material on the substrate, thereby obtaining a greater selectivity of processing of first layer material (e.g., $304a_1$, $304a_2$, ..., $304a_n$) than other material (e.g., second layers $304b_1$, $304b_2$, ..., $304b_n$) in the multi-material layers 304.

The plasma excited species or radicals are used to etch portions of the multi-material layers 304, using a patterned photoresist layer (not shown) as a mask. The etching may be continued until a predetermined depth of a feature 314 is formed in the multi-material layer 304. The feature 314 may be a contact hole, via, trench or any structure with a desired profile. FIG. 3A shows one embodiment where the multi-material layer 304 has features 314 formed through the first layers $304a_1$, $304a_2$, ..., $304a_n$ and the second layers $304b_1$, $304b_2$, ..., $304b_n$, thereby exposing the top surface of the substrate 300.

In one embodiment, the etching gas mixture selected to etch the multi-material layer 304 includes at least a fluorine-containing chemistry. Suitable examples of the fluorine-containing chemistry include $NF_3$, $XeF_2$, ClF, $ClF_3$, $ClF_5$, and $F_2$, and the like. Additionally or alternatively, the etching gas mixture may use a fluorine-carbon containing gas having a formula $C_xF_y$, wherein x and y are integers ranging from 1 to 8 and 8 to 34 respectively. Suitable examples of the fluorine-carbon containing gas may include $CF_4$, $C_2F_6$, $C_3F_6$, $C_4F_6$, $C_4F_8$, $C_5F_{10}$, $C_6F_8$, and the like. In one exemplary implementation, the fluorine-containing chemistry in the etching gas mixture includes $NF_3$. If desired, other halogen containing gas, $SF_6$, $Cl_2$, $Br_2$, HCl, and the like, may also be supplied into the etching gas mixture during etching.

During etch processing, a RF bias power may be optionally provided to the substrate to provide directionality to the plasma or radicals to enhance selectivity for removal of target materials from the multi-material layer 304. The RF bias power may be provided at a power level of about 50 W to about 300 W (300 mm substrate) and a low frequency, such as less than 2.5 MHz, for example about 300 kHz to 2 MHz. The etching gas mixture may be maintained at a flow rate by volume between about 20 sccm and about 500 sccm. The processing system may be maintained at a pressure of about 2 Torr and about 20 Torr, such as about 8 Torr to about 10 Torr. The temperature of the processing system may be maintained at about −100° C. to about 100° C., for example about 2° C. to about 10° C. It is believed that etching at higher pressure and lower temperature ensures a better top to bottom loading (i.e., amount of target materials consumed at top portion versus bottom portion). Etching at lower temperature may be advantageous because surface reaction rate is decreased exponentially. In cases where the target layers are W, Si, or SiN, it has been observed that controlling surface reaction rate will help achieve a better top to bottom loading.

During etch processing, the plasma excited species or radicals of the fluorine-containing chemistry, for example $NF_3$, are recombined into $F_2$ species under high chamber pressure. As $F_2$ species etch target materials (e.g., W/TiN or SiN etc.) at a speed relatively faster than SiO, adequate etching selectivity of materials can be obtained. Therefore, a highly uniform recess etch of target materials throughout the entire multi-material layer 304 is achieved.

In order to achieve better top to bottom loading of the feature 314 formed in the multi-material layer 304, the top portion of the feature 314 may be selectively covered with a passivation layer 316 while the bottom portion of the feature 314 is free from the passivation layer. In some embodiments, the passivation layer 316 is formed on exposed surfaces at the top portion of the multi-material layer 304 to protect the top portion of the features 314 from being overly etched and attached during the early stages of the etch process. It should be noted that the top portion of the features 314 in this disclosure may generally refer to at least first layers $304a_1$ and $304a_2$ and second layers $304b_1$ and $304b_2$. In some cases, a ratio of the coverage of the passivation layer 316 to a depth of the feature 314 may be about 1:2 to about 1:8, such as about 1:3 to about 1:5.

Since the lower portion of the feature 314 not covered by the passivation layer can be etched more with respect to the top portion of the feature 314, the top portion of the features 314, which would have been overly etched due to longer exposure to the etching chemistry, will now be etched at a slower rate matching the etching rate at the bottom portion of the features 314. As a result, proper critical dimension throughout the length of the features 314 is obtained. While the passivation layer 316 is formed conformally or substantially conformally on the sidewalls of the top portion of the features 314, it is contemplated that the passivation layer 316 may also be formed on the sidewalls of the bottom portion of the features 314, depending on the target material to be removed and/or the etching chemistry used.

The passivation layer 316 may be formed from the same material as the underneath material that is covered by the passivation layer 316. The passivation layer 316 protects the top portion with a material identical to the underlying material to have the top and bottom etch rate equal. In one implementation, the material of the passivation layer 316 can be Si based material comprising Si, N, O, C, and H. For example, the passivation layer 316 may be any suitable carbon doped $Si_xO_yN_zH_w$ material, wherein x, y, z, and w can be all integers such that x+y+z+w is greater than zero. In one implementation, the material of the passivation layer 316 can be W based material comprising W, N, O, C, and H. For example, the passivation layer 316 may be any suitable carbon doped $W_xO_yN_zH_w$ material, wherein x, y, z, and w can be all integers such that x+y+z+w is greater than zero. In one implementation, the material of the passivation layer 316 can be Ti based material comprising Ti, N, O, C, and H. For example, the passivation layer 316 may be any suitable carbon doped $Ti_xO_yN_zH_w$ material, wherein x, y, z, and w can be all integers such that x+y+z+w is greater than zero. In one implementation, the material of the passivation layer 316 can be Ta based material comprising Ta, N, O, C, and H. For example, the passivation layer 316 may be any suitable carbon doped $Ta_xO_yN_zH_w$ material, wherein x, y, z, and w can be all integers such that x+y+z+w is greater than zero. The passivation layer 316 may be formed either thermally or with in-situ plasma. A RF bias power may be optionally used to enhance formation of the passivation layer 316. The RF bias power may be provided at a power level of about 50 W to about 300 W (300 mm substrate) and a low frequency, such as less than 2.5 MHz, for example about 300 kHz to 2 MHz.

In one alternative implementation, which may be combined with any of other implementations mentioned in this disclosure, the top portion of the features 314 may be subjected to a pre-treatment process to make it less reactive with the subsequent plasma excited species or radicals of the etching chemistry. Therefore, the bottom portion of the features 314 will be etched faster than the top portion of the features 314 in a subsequent stage. For example, the top portion of the features 314 may be oxidized so that the top portion is reacted with the etching species or radicals at a much slower rate than the bottom portion of the features 314. This is because $F_2$ species or radicals react with oxides (e.g., tungsten oxides or silicon oxides) at a relatively slower rate than the silicon nitrides or silicon. Since the oxidized top portion of the features 314 is etched at the same rate or an etching rate that is slightly slower the bottom portion of the features 314 which is not oxidized by the pre-treatment process, it is possible to achieve uniform profile and proper critical dimension of the feature 314 formed in the multi-material layer 304.

The thickness of the oxide layer 318 may be gradually reduced along the depth of the features 314, as shown in FIG. 3B. In some cases, the thickness of the oxide layer 318 at or around the middle portion of the features 314 is reduced to zero after oxidization. A ratio of the coverage of the oxide layer 318 (i.e., oxidized region) to a depth of the feature 314 may be about 1:2 to about 1:8, such as about 1:3 to about 1:5. During pre-treatment process, an oxygen-containing gas is supplied to assist in oxidizing of the top portion of the features 314. The pre-treatment process can include plasma treatment or thermal treatment, with inert gases or active gases such as hydrogen, oxygen, or nitrogen. Examples of the inert gas supplied in the gas mixture include Ar, He, Ne, Kr, Xe or the like. Suitable examples of the oxygen-containing gas may be species or radicals of $O_2$, $NO_2$, $N_2O$, CO, $CO_2$, $H_2O_2$, $O_3$, and the like. The oxygen-containing gas may be flowed into the gas reaction region 130 at a first flow rate, which can be any suitable flowing rate, for example about 20 sccm and about 2500 sccm, such as about 80 sccm to about 500 sccm. Plasma excited species or radicals of the fluorine-containing chemistry may or may not be introduced into the gas reaction region 130 at this stage.

While flowing the oxygen-containing gas, the chamber pressure may be maintained at a pressure of about 1 Torr to control the oxidization occurring mainly at the top portion of the features 314. After the pre-treatment process, the flow of the oxygen-containing gas is turned off and the chamber pressure is raised to about 5 Torr to 20 Torr, for example about 7 Torr to 8 Torr. The etching species or radicals as discussed above may then be introduced into the gas reaction region 130 of the processing system to etch the lower portion of the feature 314. The etching species or radicals may be flowed into the gas reaction region 130 at a second flow rate that is slower than the first flowing rate of the oxygen-containing gas. Due to the presence of the oxidization layer 318, the top portion of the features 314 will be etched at a slower etching rate than the lower portion. As a result, a uniform profile and proper critical dimension throughout the features 314 is obtained.

In yet another embodiment, which may be combined with any of other embodiments mentioned in this disclosure, a post-treatment process can be performed after etching process and/or the pre-treatment process to help top to bottom loading by driving out all etch by-products generated during the etch process from both top and bottom portions of the features 314. Specifically, the post-treatment process uses a purging gas to remove fluorine residues or fluoride, oxides or oxyfluorides of tungsten at the sidewalls or the bottom of the features 314, which may otherwise result in early close-up of the features 314 being formed in the multi-material layer 304 and thus preventing etching through the entire film stack 304 to expose the substrate 300. In one exemplary implementation, the purging gas may include an inert gas such as helium or argon. The purging gas may optionally include an oxygen gas, hydrogen gas, or a nitrogen gas. The purging gas may be supplied to the processing system at a flow rate by volume of between about 20 sccm and about 12500 sccm, such as about 100 sccm to about 2000 sccm, for example about 550 sccm to about 1200 sccm, to drive etch by-products out of the features 314. The post-treatment process may be performed for about 15 seconds to about 60 seconds, for example about 30 seconds.

Benefits of the present disclosure include improved etch processes for uniformly recessing a sidewall of high aspect ratio features (e.g., trenches or contact holes) of 3D NAND that has alternating layers of conductive layers or insulating layers by exposing the sidewall of the features to a remote plasma formed from F-based chemistry at low temperature and high pressure conditions to achieve 1:1 top to bottom loading (i.e., amount of target materials consumed at top portion versus bottom portion). The top portion of the sidewall can be selectively covered with a passivation layer to ensure proper critical dimension throughout the length of the features. In some cases, the top portion of the sidewall can be treated before the etch process to make it less reactive with the subsequent plasma excited species or radicals of the etching chemistry than the lower portion, which in turn results in better top to bottom loading. These chemistry-based isotropic etch processes and passivation/treatments help form high aspect ratio features with accurate and uniform profiles for three dimensional (3D) stacking of semiconductor chips. As a result, lower process cost, better process repeatability and minimized environment impact can be obtained.

While the foregoing is directed to implementations of the present disclosure, other and further implementations of the disclosure may be devised without departing from the basic scope thereof.

The invention claimed is:

1. A method for processing a substrate in a process chamber, comprising:
forming one or more features extending in a multi-material layer formed on a substrate to expose a portion of a top surface of the substrate by exposing the substrate to radicals of a remotely formed plasma, the one or more features each including top portions of sidewalls of the multi-material layer, bottom portions of the sidewalls of the multi-material layer, and the exposed portion of the top surface of the substrate, and the multi-material layer comprising alternating layers of a first dielectric layer and a second dielectric layer, wherein the remotely formed plasma is formed from an etching gas mixture comprising a fluorine-containing chemistry, and
wherein the process chamber is maintained at a pressure of about 2 Torr to about 20 Torr and a temperature of about −100° C. to about 100° C.;
subsequent to the forming of the one or more features, selectively oxidizing the top portions of the sidewalls of the multi-material layer and not oxidizing the bottom portions of the sidewalls of the multi-material layer, wherein a ratio of the height of the oxidized top portions to a depth of the one or more features is about 1:2 to about 1:8; and
subjecting the multi-material layer to an etch process.

2. The method of claim 1, wherein the first dielectric layer is formed of a first conductive material and the second dielectric layer is formed of a second conductive material chemically different from the first conductive material.

3. The method of claim 2, wherein the first conductive material and the second conductive material comprise n-type or p-type doped silicon, tungsten (W), tungsten silicide (WSi), tungsten polysilicon (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, or nitride compound thereof.

4. The method of claim 3, wherein the first conductive material is W and the second conductive material is TiN or TaN.

5. The method of claim 1, wherein the first dielectric layer is formed of a first dielectric material and the second dielectric layer is formed of a second dielectric material chemically different from the first dielectric material.

6. The method of claim 5, wherein the first dielectric layer and the second dielectric layer comprise silicon oxide, silicon nitride, silicon oxynitride, silicon carbide, silicon oxycarbide, or composite of oxide and nitride.

7. The method of claim 5, wherein the first dielectric layer and/or the second dielectric layer comprise hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), or platinum zirconium titanium (PZT).

8. The method of claim 1, wherein the fluorine-containing chemistry in the etching gas mixture includes $NF_3$, $XeF_2$, ClF, $ClF_3$, $ClF_5$, or $F_2$.

9. The method of claim 1, wherein the etching gas mixture further comprises a halogen containing gas.

10. The method of claim 1, further comprising:
biasing the substrate while exposing the substrate having the multi-material layer formed thereon to radicals of a plasma.

11. A method for processing a substrate in a process chamber, comprising:
exposing a substrate having a multi-material layer formed thereon to radicals of a remote plasma to form one or more features in the multi-material layer, the one or more features exposing a portion of a top surface of the substrate, and the multi-material layer comprising alternating layers of a first dielectric layer and a second dielectric layer that is chemically different from the first dielectric layer;
exposing top portions of sidewalls of the multi-material layer to an oxygen-containing gas to selectively oxidize the top portions of the sidewalls of the multi-material layer and not to oxidize bottom portions of the sidewalls of the multi-material layer, wherein a ratio of the coverage of the oxidized top portions of the sidewalls of the multi-material layer to a depth of the feature of the one or more features is 1:2 to about 1:8; and
purging the process chamber.

12. The method of claim 11, wherein the remote plasma is formed from $NF_3$, $XeF_2$, ClF, $ClF_3$, $ClF_5$, or $F_2$.

13. The method of claim 11, wherein the first dielectric layer is formed from tungsten (W), and the second dielectric layer is formed from titanium nitride (TiN) or tantalum nitride (TaN).

* * * * *